(12) United States Patent
Abenaim et al.

(10) Patent No.: US 10,181,493 B2
(45) Date of Patent: Jan. 15, 2019

(54) RADIATION DETECTOR SYSTEM OF RADIATION IMAGING MODALITY

(71) Applicant: ANALOGIC CORPORATION, Peabody, MA (US)

(72) Inventors: Daniel Abenaim, Lynnfield, MA (US);
Randy Luhta, Chardon, OH (US);
Ruvin Deych, Gloucester, MA (US);
Andrew Litvin, Wakefield, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 15/549,249

(22) PCT Filed: Feb. 6, 2015

(86) PCT No.: PCT/US2015/014746
§ 371 (c)(1),
(2) Date: Aug. 7, 2017

(87) PCT Pub. No.: WO2016/126260
PCT Pub. Date: Aug. 11, 2016

(65) Prior Publication Data
US 2018/0026071 A1   Jan. 25, 2018

(51) Int. Cl.
*G01T 1/20* (2006.01)
*H01L 27/146* (2006.01)

(52) U.S. Cl.
CPC ...... *H01L 27/14661* (2013.01); *G01T 1/2002* (2013.01); *H01L 27/1469* (2013.01); *H01L 27/14663* (2013.01)

(58) Field of Classification Search
CPC . G01T 1/2018; G01T 1/2985; H01L 27/1463; H01L 27/14634; H01L 27/14659;
(Continued)

(56) References Cited

U.S. PATENT DOCUMENTS 5,241,576 A * 8/1993 Lonn .................. G01T 1/2985
                                                        250/363.02
5,378,894 A * 1/1995 Akai .................... G01T 1/2002
                                                        250/367
(Continued)

FOREIGN PATENT DOCUMENTS

WO      2010/109353 A2    9/2010

OTHER PUBLICATIONS

Corresponding PCT International Application No. PCT/US2015/014746, Filing Date Feb. 6, 2015, International Search Report and Written Opinion, dated Oct. 15, 2015 (9 pgs).

*Primary Examiner* — Kiho Kim
(74) *Attorney, Agent, or Firm* — TraskBritt

(57) ABSTRACT

Among other things, a detection assembly of a radiation detector system is provided. In some embodiments, the detection assembly comprises a plurality of detector elements. Respective detector elements include a scintillator array, a photodetector array supporting the scintillator array on a first side of the photodetector array, and an electrical contact disposed on a second side of the photodetector array. In some embodiments, the detection assembly includes a printed circuit board. The electrical contact of respective detector elements is bonded to the printed circuit board to physically and electrically couple respective detector elements to the printed circuit board. A method of fabricating a detection assembly of a radiation detector system is also provided.

20 Claims, 11 Drawing Sheets

(58) Field of Classification Search
CPC ......... H01L 27/14663; H01L 27/16225; H01L 25/16; H01L 23/42; H01L 24/48
See application file for complete search history.

(56) References Cited

U.S. PATENT DOCUMENTS

| | | | |
|---|---|---|---|
| 2004/0179650 A1* | 9/2004 | Hoffman | G01T 1/2018 378/98.8 |
| 2005/0161608 A1 | 7/2005 | Heismann | |
| 2006/0231767 A1* | 10/2006 | Danzer | G01T 1/2985 250/370.11 |
| 2009/0314947 A1* | 12/2009 | Goushcha | G01T 1/2018 250/363.01 |
| 2010/0327173 A1* | 12/2010 | Woychik | H01L 25/16 250/370.09 |
| 2011/0158387 A1 | 6/2011 | Narayanaswamy et al. | |
| 2012/0145905 A1* | 6/2012 | Nomura | G01T 1/202 250/336.1 |
| 2014/0270057 A1* | 9/2014 | Bartolome | G01N 23/046 378/19 |

* cited by examiner

RADIATION DETECTOR SYSTEM OF RADIATION IMAGING MODALITY

CROSS-REFERENCE TO RELATED APPLICATIONS

This application is a national phase entry under 35 U.S.C. § 371 of International Patent Application PCT/US2015/014746, filed Feb. 6, 2015, designating the United States of America and published in English as International Patent Publication WO 2016/126260 A1 on Aug. 11, 2016.

BACKGROUND

This disclosure relates to measuring radiation attenuation by an object exposed to radiation. It finds particular application in the field of computed tomography (CT) imaging utilized in medical, security, and/or industrial applications, for example. However, it also relates to other radiation imaging modalities where converting radiation energy into digital signals may be useful, such as for imaging and/or object detection.

Radiation imaging modalities such as CT systems, single-photon emission computed tomography (SPECT) systems, digital projection systems, and/or line-scan systems, for example, are useful to provide information, or images, of interior aspects of an object under examination. In many such systems, the object is exposed to radiation comprising photons (e.g., such as x-rays, gamma rays, etc.), and an image(s) is formed based upon the radiation absorbed and/or attenuated by the interior aspects of the object, or rather a number of radiation photons that are able to pass through the object. Highly dense aspects of the object absorb and/or attenuate more radiation than less dense aspects, and thus an aspect having a higher density, such as a bone or metal, for example, will be apparent when surrounded by less dense aspects, such as muscle or clothing. In other systems, such as SPECT systems, a gamma-emitting radioisotope, is delivered into a patient and gamma rays emitted from the patient are measured to generate the images.

The radiation detector system typically comprises a plurality of detector elements, respectively configured to convert detected radiation into electrical signals. Based upon the number of radiation photons detected by respective detector elements and/or the electrical charge generated by respective detector elements between samplings, images can be reconstructed that are indicative of the density, z-effective, shape, and/or other properties of the object and/or aspects thereof.

BRIEF SUMMARY

Aspects of this disclosure address the above matters, and others. According to one aspect, a detection assembly of a radiation detector system is provided. The detection assembly comprises a detector element comprising a scintillator array, a photodetector array supporting the scintillator array on a first side of the photodetector array, and an electrical contact disposed on a second side of the photodetector array. The detection assembly also comprises a printed circuit board. The electrical contact is bonded to the printed circuit board to physically and electrically couple the detector element to the printed circuit board.

According to another aspect, a method of fabricating a detection assembly of a radiation detector system is provided. The method comprises acquiring a detector element comprising a photodetector array and an electrical contact disposed on a second side of the photodetector array. The method comprises bonding the electrical contact to a printed circuit board to physically and electrically couple the detector element to the printed circuit board.

According to yet another aspect, a radiation imaging system is provided. The radiation imaging system comprises a radiation source configured to emit radiation photons and a radiation detector system configured to receive the emitted radiation photons. The radiation detector system comprises a detection assembly, which comprises a plurality of detector elements. A first detector element of the detection assembly comprises a scintillator array, a photodetector array supporting the scintillator array on a first side of the photodetector array, and an electrical contact disposed on a second side of the photodetector array. A second detector element of the detection assembly comprises a second scintillator array, a second photodetector array supporting the second scintillator array on a first side of the second photodetector array, and a second electrical contact disposed on a second side of the second photodetector array. The detection assembly also comprises a printed circuit board. The electrical contact is bonded to the printed circuit board to physically and electrically couple the detector element to the printed circuit board and the second electrical contact is bonded to the printed circuit board to physically and electrically couple the second detector element to the printed circuit board.

Those of ordinary skill in the art will appreciate still other aspects of this disclosure upon reading and understanding the appended description.

BRIEF DESCRIPTION OF THE DRAWINGS

This disclosure is illustrated by way of example and not limitation in the figures of the accompanying drawings, in which like references generally indicate similar elements and in which.

DETAILED DESCRIPTION

Figure 1:
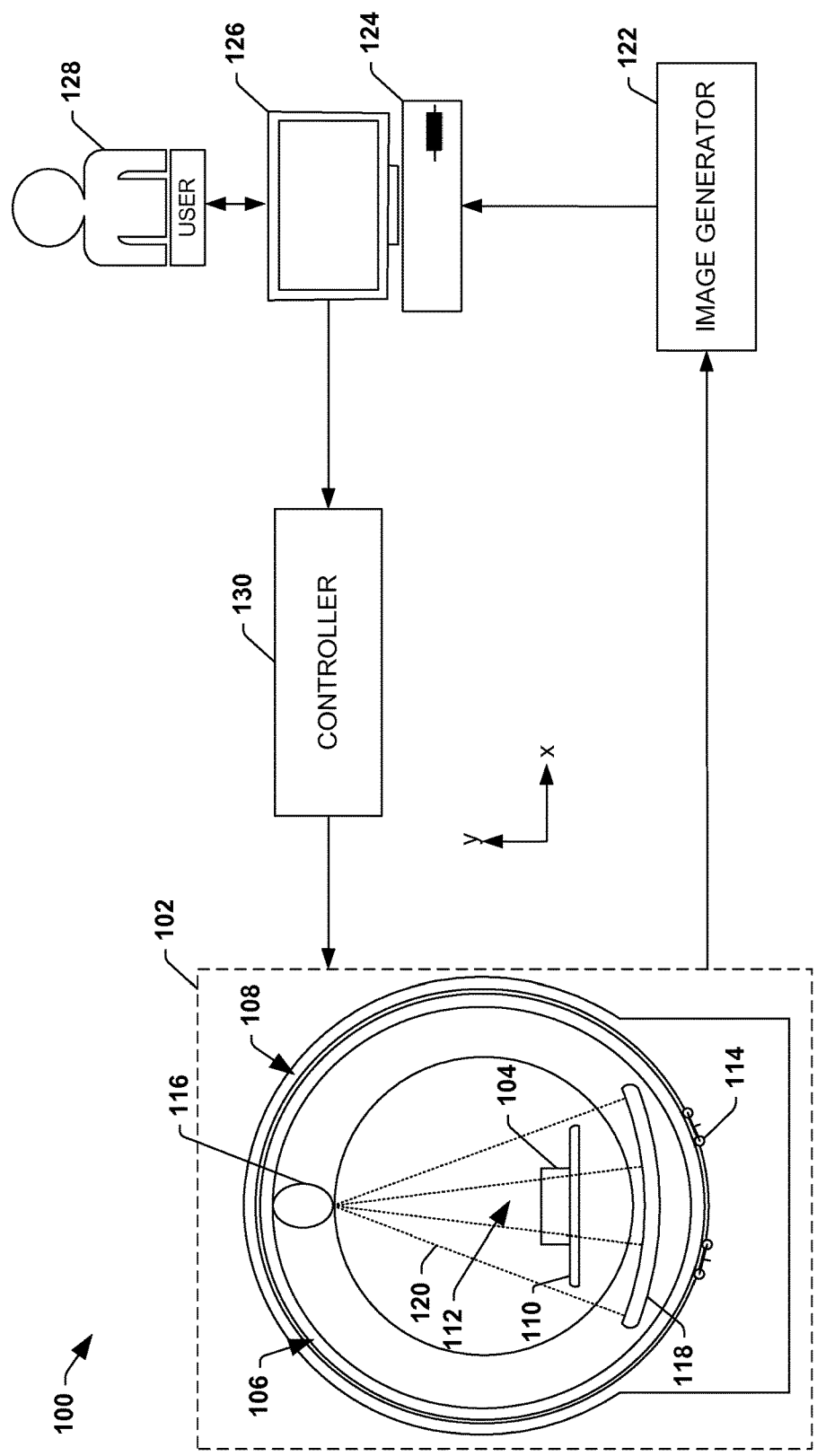
FIG. 1 illustrates an example environment of a radiation imaging modality.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

Among other things, a detection assembly of a radiation detector system is provided herein. The detection assembly may comprise one or more detector elements respectively configured to detect radiation impinging a region occupied by the detector element. In some embodiments, the detector elements are configured to detect radiation via an indirect conversion technique (e.g., where the radiation is converted into light energy which is then converted into electrical energy).

In some embodiments, respective detector elements comprise a scintillator array configured to convert detected radiation photons into luminescent photons and one or more photodetectors configured to convert the luminescent photons into electrical charge to generate an analog signal indicative of the detected radiation. The detector elements are electrically coupled to an electronics sub-assembly of the detection assembly. The electronics sub-assembly is configured to, among other things, process the analog signals by filtering and/or digitizing the analog signals. By way of example, the electronics sub-assembly may comprise electronic circuitry, including an A/D converter, configured to convert analog signals generated by respective photodetectors into digital signals.

In some embodiments, the detector elements and the electronics sub-assembly are arranged on a printed circuit board of the detection assembly. For example, electrical contacts of the detector elements can be bonded to the printed circuit board to physically and electrically couple the detector elements to the printed circuit board. The detector elements can be fabricated as part of a wafer level or panel level processing. In an example, one or more components of the detector elements (e.g., scintillator array, optically reflective material, electrical contacts, etc.) can be arranged on a photodetector wafer. The photodetector wafer can be scored (e.g., cut) so as to produce at least a portion of the detector element. This portion of the detector element can then be arranged on the printed circuit board using a pick-and-place machine or other surface mount technology, for example.

FIG. 1 illustrates an example environment 100 of a radiation imaging system comprising one or more detector assemblies as provided herein. Such detector assemblies may find applicability with computed tomography (CT) systems, line-scan systems, digital projection systems, diffraction systems, and/or other systems comprising a radiation detector system. Moreover, it may be appreciated that the example environment 100 merely provides an example arrangement and is not intended to be interpreted in a limiting manner, such as necessarily specifying the location, inclusion, and/or relative position of the components depicted therein.

In the example environment 100, an object examination apparatus 102 is configured to examine one or more objects 104 (e.g., a series of suitcases at an airport, a human patient, etc.). The object examination apparatus 102 can comprise a rotor 106 and a stator 108. During an examination of the object(s) 104, the object(s) 104 can be placed on a support article 110, such as a bed or conveyor belt, that is selectively positioned in an examination region 112 (e.g., a hollow bore in the rotor 106 in which the object(s) 104 is exposed to radiation 120), and the rotor 106 can be rotated about the object(s) 104 by a rotator 114 (e.g., motor, drive shaft, chain, etc.).

The rotor 106 can surround a portion of the examination region 112 and can comprise one or more radiation sources 116 (e.g., an ionizing x-ray source, gamma-ray source, etc.) and a radiation detector system 118 that is mounted on a substantially diametrically opposite side of the rotor 106 relative to the radiation source(s) 116. During an examination of the object(s) 104, the radiation source(s) 116 emits fan and/or cone shaped radiation 120 configurations into the examination region 112 of the object examination apparatus 102. It may be appreciated that such radiation 120 can be emitted substantially continuously and/or can be emitted intermittently (e.g., a short pulse of radiation 120 is emitted followed by a resting period during which the radiation source(s) 116 is not activated).

As the emitted radiation 120 traverses the object(s) 104, the radiation 120 can be attenuated differently by different aspects of the object(s) 104. Because different aspects attenuate different percentages of the radiation 120, an image(s) can be generated based upon the attenuation, or variations in the number of radiation photons that are detected by the radiation detector system 118. For example, more dense aspects of the object(s) 104, such as a bone or metal plate, can attenuate more of the radiation 120 (e.g., causing fewer photons to be detected by the radiation detector system 118) than less dense aspects, such as skin or clothing.

The radiation detector system 118 comprises a plurality of detector elements arranged one on or more detection assemblies (e.g., also referred to as detection modules, detector modules, and/or the like), which are coupled together to form the radiation detector system 118. In some embodiments, the detector elements are configured to indirectly convert (e.g., using a scintillator array and photodetectors) detected radiation into analog signals. Further, as will be described in more detail below, the radiation detector system 118, or detection assemblies thereof, may comprise electronic circuitry, such as an analog-to-digital (A/D) converter, configured to filter the analog signals, digitize the analog signals, and/or otherwise process the analog signals and/or digital signals generated therefrom. Digital signals output from the electronic circuitry may be conveyed from the radiation detector system 118 to digital processing components configured to store data associated with the digital signals and/or further process the digital signals.

In some embodiments, the digital signals are transmitted to an image generator 122 configured to generate image space data, also referred to as images, from the digital signals using a suitable analytical, iterative, and/or other reconstruction technique (e.g., backprojection reconstruction, tomosynthesis reconstruction, iterative reconstruction, etc.). In this way, the data is converted from projection space to image space, a domain that may be more understandable by a user 128 viewing the image(s), for example. Such image space data may depict a two dimensional representation of the object 104 and/or a three dimensional representation of the object 104. In other embodiments, the digital signals are transmitted to other digital processing components, such as a threat analysis component, for processing.

The example environment 100 also comprises a terminal 124, or workstation (e.g., a computer), configured to receive the image(s), which can be displayed on a monitor 126 to the user 128 (e.g., security personnel, medical personnel, etc.). In this way, a user 128 can inspect the image(s) to identify areas of interest within the object(s) 104. The terminal 124 can also be configured to receive user input which can direct operations of the object examination apparatus 102 (e.g., a speed of a conveyor belt, activation of the radiation source (s) 116, etc.).

In the example environment 100, a controller 130 is operably coupled to the terminal 124. The controller 130 may be configured to control operations of the object examination apparatus 102, for example. By way of example, in some embodiments, the controller 130 is configured to receive information from the terminal 124 and to issue instructions to the object examination apparatus 102 indicative of the received information (e.g., adjust a speed of a conveyor belt).

Figure 2:
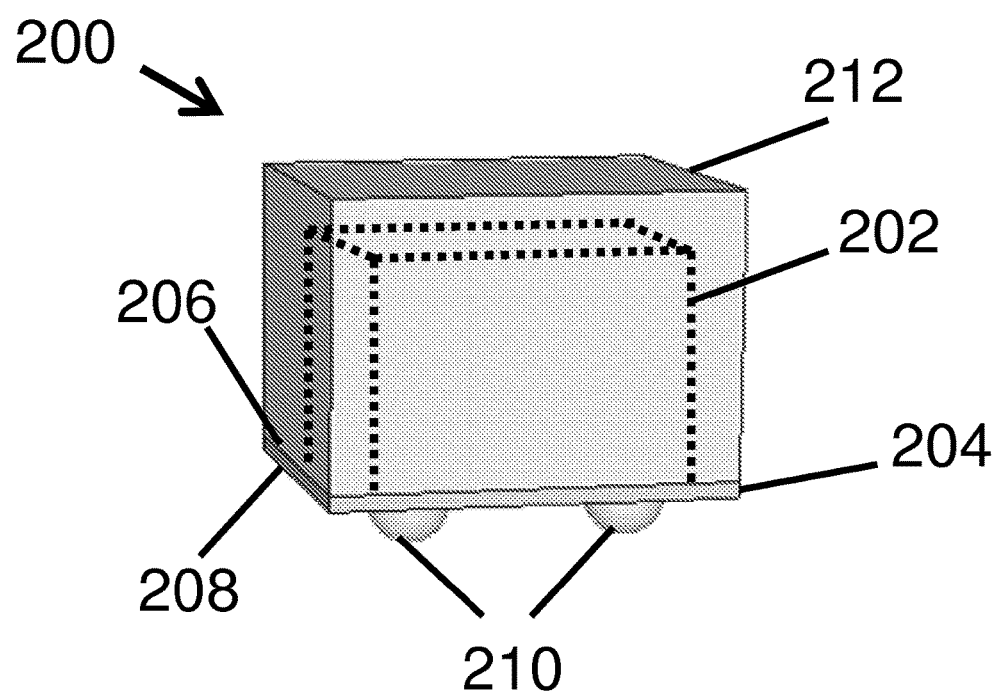
FIG. 2 illustrates a three-dimensional perspective view of an example detector element.

Turning to FIG. 2, an example detector element 200 of a detection assembly of the radiation detector system 118 is illustrated. While one detector element 200 is illustrated in FIG. 2, it will be appreciated that the radiation detector system 118, and detection assemblies thereof, may comprise a plurality of detector elements 200. The detector elements 200 can be supported in any number of ways, such as by being bonded to a printed circuit board, for example, as will be described in more detail with respect to FIG. 3.

In an example, the detector element 200 comprises a scintillator array 202 comprising one or more scintillators, a photodetector array 204 comprising one or more photodetectors, and an optically reflective material 212. The scintillator array 202 may comprise Gadolinium Oxysulfide (GOS), Cadmium Tungstate, Bismuth Germanate, Cesium Iodide, Sodium Iodide, Lutetium Orthosilicate, an amorphous material, and/or other materials capable of converting radiation photons into luminescent photons. The photodetector array 204 comprises one or more photodetectors configured to convert luminescent photons into electrical charge which creates a pulse (e.g., a current pulse or voltage pulse) in an electrical signal output from the detector element 200. The one or more photodetectors of the photodetector array 204 may comprise front-illuminated photodiodes, back-illuminated photodiodes, etc.

In the illustrated example, the photodetector array 204 can support the scintillator array 202 on a first side 206 of the photodetector array 204. In this example, the photodetector array 204 is adjacent to the scintillator array 202, such as by being located in contact with a bottom surface of the scintillator array 202.

The detector element 200 comprises one or more electrical contacts 210 disposed on a second side 208 of the photodetector array 204. In some embodiments, the second side 208 is diametrically opposite the first side 206 of the photodetector array 204. In some examples, the electrical contacts 210 comprise conductive tracks, conductive pads, or other conductive materials that are capable of transmitting the electrical signal. The electrical signal that is output by the photodetector array 204 can be transmitted through the electrical contacts 210 to an electronics sub-assembly of a detection assembly to which the detector element 200 is coupled, as will be described in more detail with respect to FIG. 3.

In some examples, the detector element 200 comprises an optically reflective material 212. The optically reflective material 212 may comprise a polymer binder having titanium oxide powder suspended therein, although other suitable materials are also contemplated. For example, the optically reflective material 212 may comprise titanium dioxide ($TiO_2$), zinc oxide (ZnO) and/or zinc sulfide (ZnS) suspended within a polymer binder. In some embodiments, the polymer binder is an epoxy that is applied to the scintillator array 202 in a liquid or semi-liquid state and cured into a solid. In still other embodiments, the optically reflective material 212 comprises a metallic mirror and/or polytetrafluoroethylene.

The scintillator array 202, or scintillators thereof, can be at least partially surrounded by the optically reflective material 212. For example, the scintillator array 202 may be surrounded on a top wall (e.g., diametrically opposing a bottom wall in contact with the photodetector array 204), and one or more lateral walls (e.g., extending perpendicularly to the bottom wall) by the optically reflective material 212. The optically reflective material 212 can allow for the passage of the radiation photon(s) through the optically reflective material 212 and to the scintillator array 202 while reducing and/or limiting luminescent photons generated by the scintillator array 202 from passing through the optically reflective material 212. Further, where the scintillator array 202 comprises a plurality of scintillators, optically reflective material 212 may be positioned within a space between each of the plurality of scintillators, for example.

The optically reflective material 212 can reduce and/or limit cross-talk between neighboring scintillator arrays 202. For example, the optically reflective material 212 can reduce and/or limit luminescent photons that are generated within the scintillator array 202 from entering another scintillator array of another detector element and/or that are generated within a first scintillator of the scintillator array 202 from entering a second scintillator of the scintillator array 202, for example. Additionally, the optically reflective material 212 can increase detector efficiency by reducing and/or limiting the loss of light energy associated with the luminescent photons escaping the scintillator array 202 (e.g., escaping a lateral wall and/or a top wall of the scintillator array 202 and not being detected by the photodetector array 204 positioned below the scintillator array 202).

Figure 3:
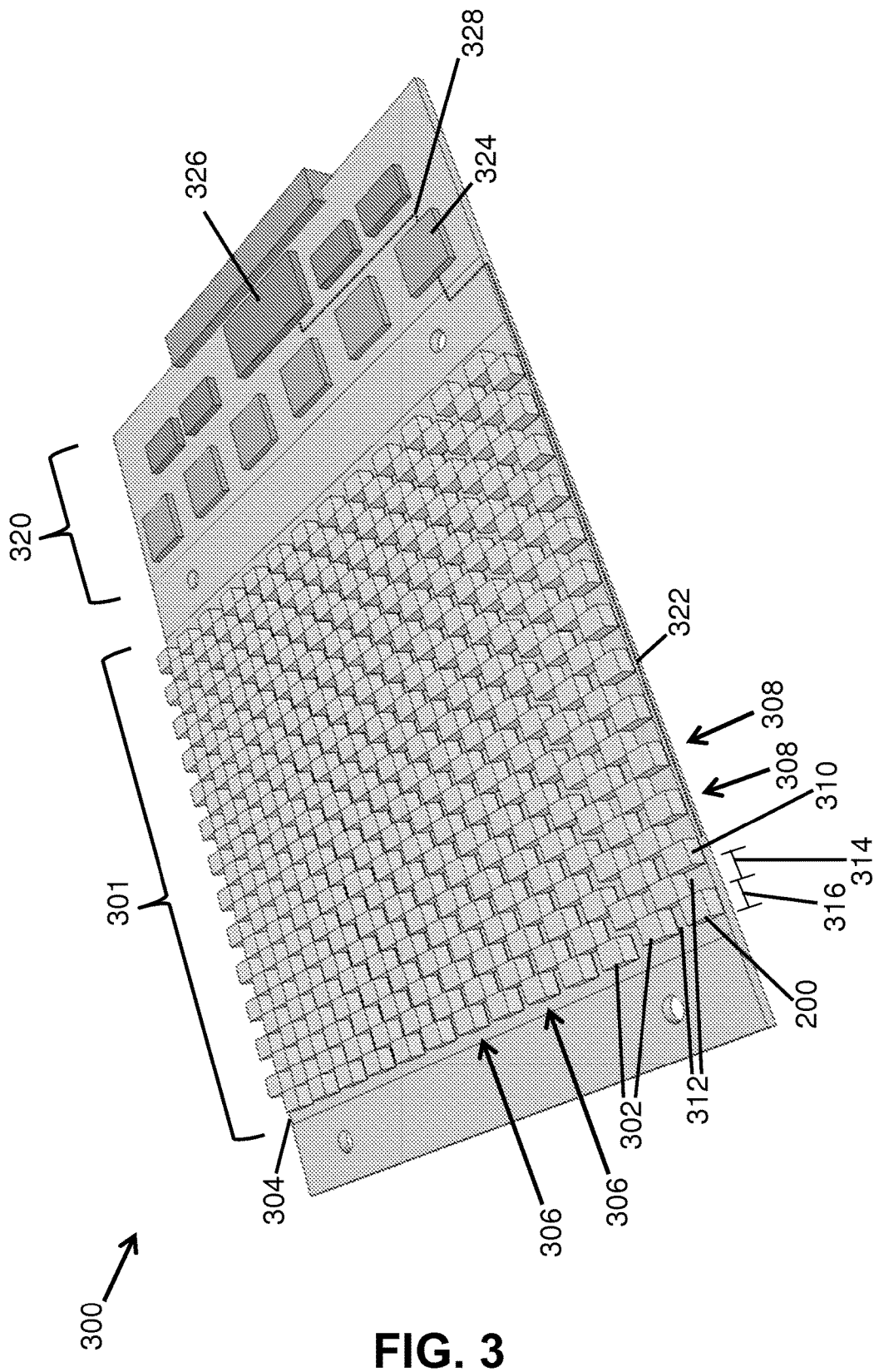
FIG. 3 illustrates a three-dimensional perspective view of an example detection assembly of a radiation detector system.

Turning to FIG. 3, an example of a detection assembly 300 of the radiation detector system 118 is illustrated. The detection assembly 300 comprises a radiation detection sub-assembly 301 that comprises one or more detector elements, such as the detector element 200 and a plurality of other detector elements 302. The plurality of other detector elements 302 may be similar in some respects to the detector element 200. For example, the plurality of other detector elements 302 may comprise a scintillator array (e.g., the scintillator array 202), a photodetector array (e.g., the photodetector array 204), one or more electrical contacts (e.g., the electrical contacts 210), an optically reflective material (e.g., the optically reflective material 212), etc.

In the illustrated embodiment, the detector element 200 and the plurality of other detector elements 302 are arranged to form a two-dimensional detection assembly, where the detector elements 200, 302, 310, etc. are arranged in multiple rows 306 and multiple columns 308. For example, the detector element 200 and the plurality of other detector elements 302 may be arranged in rows 306 and columns 308 on a printed circuit board (PCB) 304. In an example, a second detector element 310 may be comprised as part of the plurality of other detector elements 302. The second detector element 310 is arranged to neighbor the detector element 200. In the illustrated example, a space 312 can be defined between the detector element 200 and the second detector element 310. In this example, the space 312 can have a width 314 that is approximately equal to a detector width 316 of the detector element 200. In this example, a similar space (e.g., the space 312) can be defined between neighboring detector elements (e.g., 200, 302, 310, etc.) along the rows 306 and along the columns 308. That is, a detector element (e.g., 200, 302, 310, etc.) can be separated from a neighboring detector element (e.g., 200, 302, 310, etc.) by a space 312, thus creating a sparse array where voids are intentionally created between detector elements. By providing the space 312 between neighboring detector elements (e.g., 200, 302, 310, etc.), maintenance of the detection assembly 300 is facilitated. For example, removal, replacement, and/or repair of one or more of the detector elements (e.g., 200, 302, 310, etc.) is relatively easier due to the presence of the space 312 between the neighboring detector elements (e.g., 200, 302, 310, etc.). Further, cost may be reduced because less scintillator material and/or fewer photodetectors are used than if the space 312 was occupied by another detector element.

The electrical contacts (e.g., 210, etc.) of the detector elements (e.g., 200, 302, 310) can be bonded to the printed circuit board 304 to physically and electrically couple the detector elements (e.g., 200, 302, 310) to the printed circuit board 304. In an example, a second electrical contact of the second detector element 310 can be bonded to the printed circuit board 304 to physically and electrically couple the second detector element 310 to the printed circuit board 304. In these examples, by bonding the electrical contacts (e.g., 210, etc.) to the printed circuit board 304, the electrical contacts (e.g., 210, etc.) can be electrically coupled (e.g., soldered, etc.) to a conductive track, pad, electrical channel, etc. on the printed circuit board 304. As such, the detector elements (e.g., 200, 302, 310) can be electrically coupled to the printed circuit board 304 such that electrical signals can pass from the photodetector array (e.g., 204, etc.) to the printed circuit board 304. In these examples, by physically coupling the detector elements (e.g., 200, 302, 310) to the printed circuit board 304, the detector elements (e.g., 200, 302, 310) can be supported by, attached to, connected to, etc. the printed circuit board 304. While the illustrated examples illustrate the detector elements (e.g., 200, 302, 310) as being bonded to the printed circuit board 304, in other examples, the detector elements (e.g., 200, 302, 310) could be bonded to other substrates, such as a ceramic substrate, for example.

The detection assembly 300 also comprises an electronics sub-assembly 320. The electronics sub-assembly 320 can be physically coupled and/or electrically coupled to the radiation detection sub-assembly 301 (e.g., the detector elements) via a first set of one or more electrical channels 322 (e.g., embedded in and/or formed on the printed circuit board 304). In an example, power, data, etc. can be routed between the radiation detection sub-assembly 301 (e.g., or detector elements thereof) and the electronics sub-assembly 320 through the first set of one or more electrical channels 322. In some examples, the first set of one or more electrical channels 322 comprises one or more vias, metal traces, contact pads, etc.

The printed circuit board 304 comprises the first set of one or more electrical channels 322, with the first set of one or more electrical channels 322 extending between the radiation detection sub-assembly 301 and the electronics sub-assembly 320. In some embodiments, the first set of one or more electrical channels 322 extend between respective detector elements (e.g., 200, 302, 310) and one or more analog-to-digital converters 324. For example, the first set of one or more electrical channels 322 are in electrical contact with the detector elements (e.g., 200, 302, 310), such that the first set of one or more electrical channels 322 can receive the signals from the detector elements (e.g., 200, 302, 310). In this example, the analog signals from the photodetector arrays of the detector elements (e.g., 200, 302, 310) can pass to an analog-to-digital converter 324.

The electronics sub-assembly 320 comprises the analog-to-digital converter 324 disposed on the printed circuit board 304. The analog-to-digital converter 324 can process the analog signals to generate a digital output for the detector elements (e.g., 200, 302, 310). This processing may comprise, among other things, filtering the analog signals (e.g., to reduce noise, smooth the signal, enhance aspects of the signal, etc.), converting the analog signals to digital signals, and/or filtering the digital signals.

The electronics sub-assembly 320 also comprises a correction component 326 disposed on the printed circuit board 304 and a second set of one or more electrical channels 328 extending between the analog-to-digital converter 324 and the correction component 326. In an example, power, data, etc. can be routed between the analog-to-digital converter 324 and the correction component 326 through the second set of one or more electrical channels 328. In some examples, the second set of one or more electrical channels 328 comprises one or more vias, metal traces, contact pads, etc.

The digital output from the analog-to-digital converter 324 can be transmitted from the analog-to-digital converter 324 to the correction component 326 via the second set of one or more electrical channels 328. Upon receiving the digital output, the correction component 326 can weigh the digital output based upon a calibration metric, such as by multiplying the digital output by a numerical weight, for example, derived from an air scan, a dark scan, etc. to correct for errors due to manufacturing tolerances within the detector elements (e.g., 200, 302, 310), analog-to-digital converter 324, an anti-scatter grid disposed above the detection assembly 300, and/or the electrical channels 322 and/or 328, for example.

The electronics sub-assembly 320 is not limited to comprising the analog-to-digital converter 324, the correction component 326, etc. In other examples, the electronics sub-assembly 320 comprises additional analog-to-digital converters, memory arrays, resistors, capacitors, application-specific integrated circuits (ASICs), field-programmable gate arrays (FPGAs), and/or other electronic devices that are capable of being configured to perform a desired signal processing function. Moreover, the foregoing components are merely example components illustrative of the types of components that may be disposed within the electronics sub-assembly 320 and/or illustrative of some of the functions that may be performed by the electronics sub-assembly 320. The instant application is not intended to be limited to such examples. For example, in some embodiments, the electronics sub-assembly 320 may not comprise the correction component 326. In still some embodiments, the electronics sub-assembly 320 may comprise a control component, such as a field programmable gate array. In still some embodiments, control functions and correction functions may be integrated within a single element (e.g., a single chip).

It may be appreciated that FIG. 3 illustrates merely one example arrangement for detector elements wherein the detector elements are (e.g., sparsely) arranged in a checkerboard pattern (e.g., where respective detector elements are spaced apart in both the column direction and row direction by a width and length substantially equal to a width and length of the detector elements). Other arrangements are also contemplated. For example, a row of detector elements respectively abutting one another may be spaced apart from a next row of detector elements by about the width of respective detector elements. As another example, a density of detector elements disposed within a first portion (e.g., a center portion) of the printed circuit board 304 may be greater than a density of detector elements disposed within a second portion (e.g., an outer portion) of the printed circuit board 304. Further, the detector elements are not limited to being spaced apart in either or both of the column direction and/or the row direction by a width and/or a length that is substantially equal to the width and length of the detector elements. Rather, in other examples, some or all of the detector elements can be spaced apart in either or both of the column direction and/or the row direction by a width and/or a length that is larger than a width and/or a length of the detector elements. In other examples, some or all of the detector elements can be spaced apart in either or both of the column direction and/or the row direction by a width and/or a length that is smaller than a width and/or a length of the detector elements. A detection assembly 300 having detector elements spaced apart in either or both of the column direction and/or the row direction is sometimes referred to as a sparse array.

Figure 4:
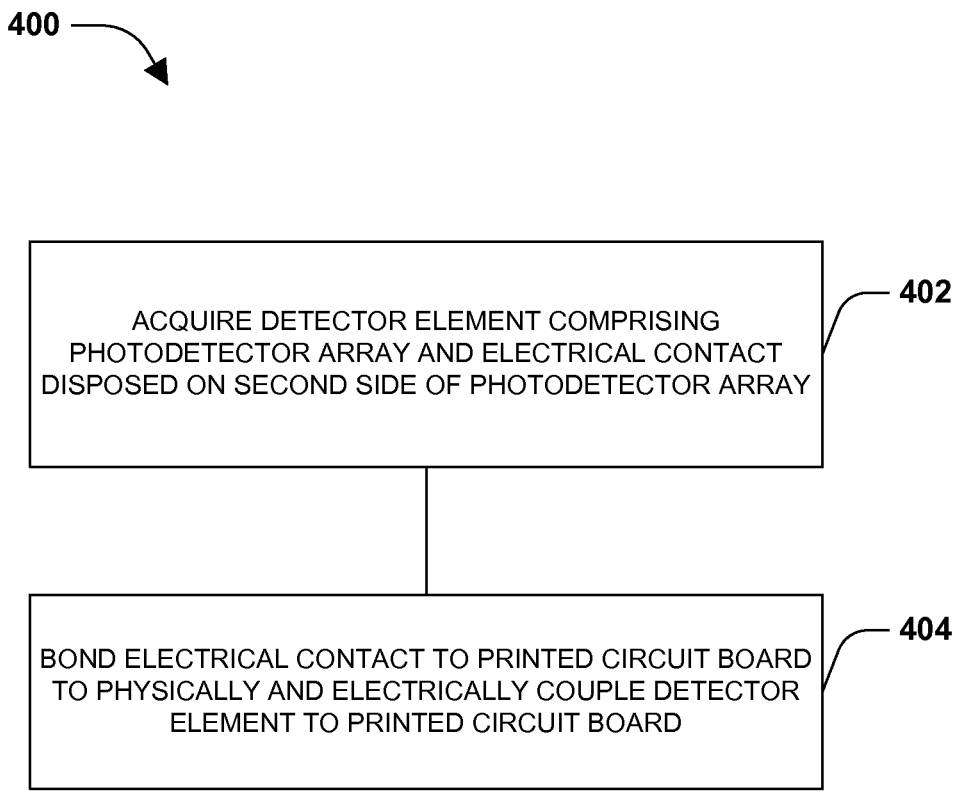
FIG. 4 illustrates an example method diagram of fabricating a detection assembly of a radiation detector system.

Turning to FIG. 4, an example method 400 of fabricating a detection assembly 300 of a radiation detector system 118 is illustrated. At 402, the method 400 comprises acquiring a detector element (e.g., 200, 302, 310) comprising a photodetector array (e.g., photodetector array 204) and an electrical contact (e.g., 210) disposed on a second side (e.g., 208) of the photodetector array (e.g., 204). As described herein, the detector element can be acquired, for example, with a carrier device (e.g., illustrated in FIG. 9).

At 404, the method 400 comprises bonding the electrical contact (e.g., 210) to a printed circuit board (e.g., 304) to physically and electrically couple the detector element (e.g., 200, 302, 310) to the printed circuit board (e.g., 304). As described herein, the electrical contact (e.g., 210) can be physically and electrically coupled to the printed circuit board (e.g., 304) by a solder bond, anisotropic conductive film (ACF) bond, conductive epoxy bond, or other bonding element.

Figure 5:
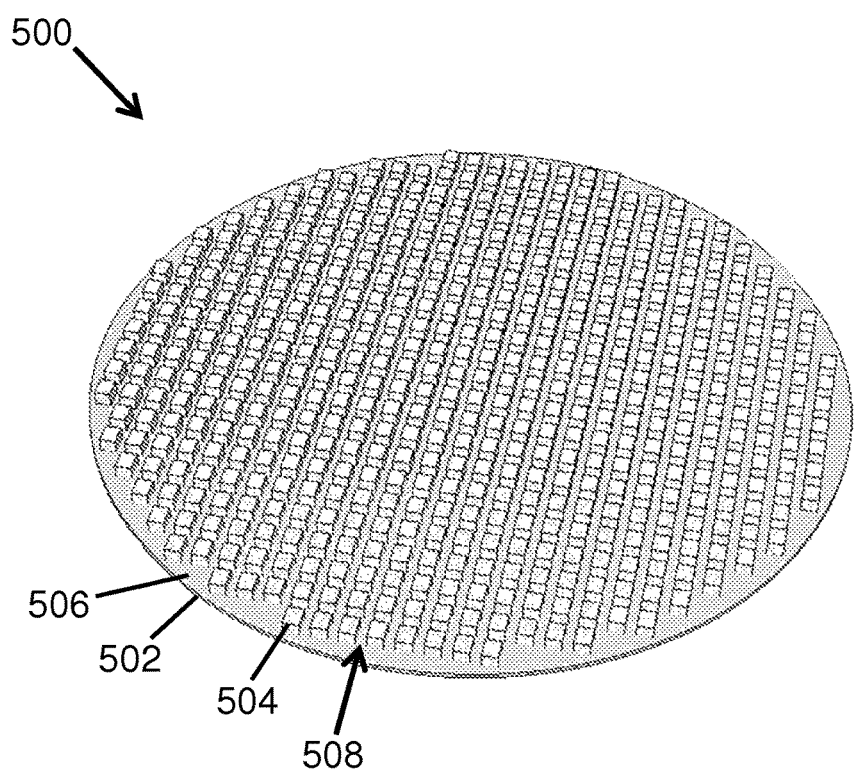
FIG. 5 illustrates a three-dimensional perspective view of an example wafer arrangement.

Turning to FIG. 5, a wafer arrangement 500 is illustrated during a process of fabricating the detection assembly 300. The wafer arrangement 500 comprises a photodetector wafer 502. One or more scintillator arrays 504 are positioned on a first side 506 of the photodetector wafer 502. In this example, the scintillator arrays 504 can be arranged on the first side 506 of the photodetector wafer 502 in a two-dimensional array with rows and columns. In such an example, the scintillator arrays 504 are spaced apart from neighboring scintillator arrays 504 to define a space 508 (e.g., a channel, a gap, an opening, etc.) between neighboring scintillator arrays 504. In an example, the scintillator arrays 504 can be positioned on the first side 506 of the photodetector wafer 502 with a pick-and-place machine or other surface mount technology.

Figure 6:
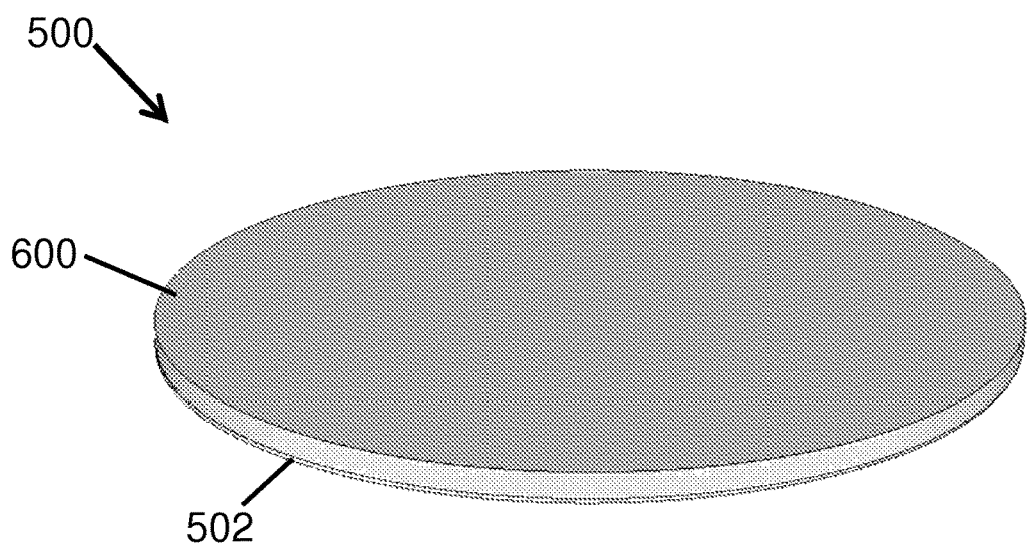
FIG. 6 illustrates a three-dimensional perspective view of an example wafer arrangement.

Turning to FIG. 6, an optically reflective material 600 can be disposed over the first side 506 of the photodetector wafer 502. In such an example, the optically reflective material 600 can be disposed over the scintillator arrays 504, in the spaces 508 between neighboring scintillator arrays 504, and in spaces between neighboring scintillators of a scintillator array 504. The optically reflective material 600 can cover an upper surface of the scintillator arrays 504 such that the optically reflective material 600 is disposed on at least five surfaces of the scintillator arrays 504 and/or on at least five surfaces of respective scintillators of the scintillator arrays 504 (e.g., if one or more of the scintillator arrays 504 comprise more than one scintillator). In an example, the optically reflective material 600 can be planarized, such that an upper surface of the optically reflective material 600 is substantially planar.

Figure 7:
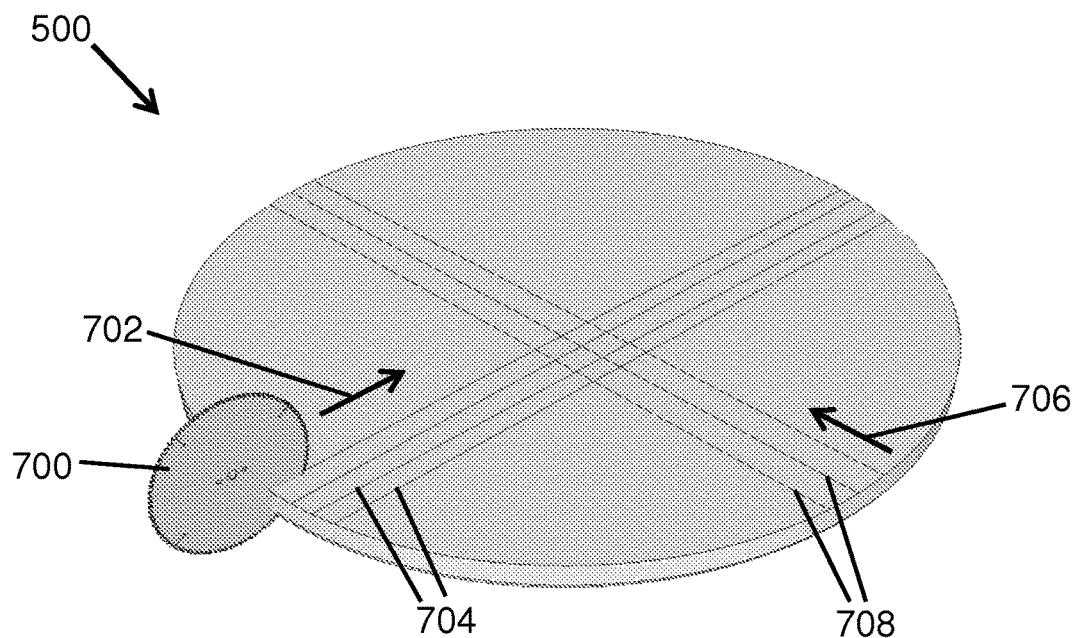
FIG. 7 illustrates a three-dimensional perspective view of an example wafer arrangement.

Turning to FIG. 7, the wafer arrangement 500 can be scored (e.g., separated, cut, partially cut, etc.) with a scoring device 700. It will be appreciated that the scoring device 700 is illustrated schematically, as the scoring device 700 comprises any number of devices that are capable of scoring the wafer arrangement 500 (e.g., the photodetector wafer 502, the optically reflective material 600, etc.). For example, the scoring device 700 can comprise blades, lasers, or the like.

In an example, the scoring device 700 can score the wafer arrangement 500 along the spaces 508 (e.g., illustrated in FIG. 5) defined between the neighboring scintillator arrays 504. For example, the scoring device 700 can score the wafer arrangement 500 along a first direction 702 to form a plurality of first score lines 704 along the first direction 702 between the scintillator arrays 504. Additionally, the scoring device 700 can score the wafer arrangement 500 along a second direction 706 to form a plurality of second score lines 708 along the second direction 706 between the scintillator arrays 504. It will be appreciated that in the example of FIG. 7, the scoring device 700 is in the process of scoring the wafer arrangement 500 such that the scoring is not yet completed. Rather, the scoring device 700 can continue to score the wafer arrangement 500 along the first direction 702 and the second direction 706 until the scintillator arrays 504 are separated from each other.

Figure 8:
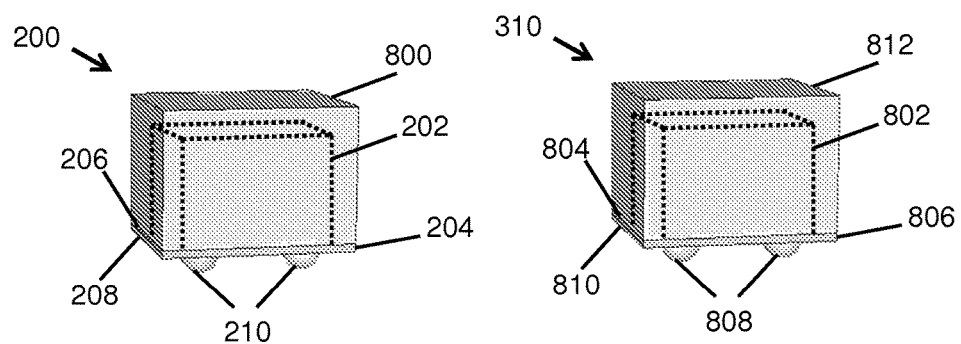
FIG. 8 illustrates a three-dimensional perspective view of example detector elements.

Turning to FIG. 8, one or more example detector elements (e.g., 200, 310) are illustrated. In this example, the detector elements (e.g., 200, 310) may be formed as a result of the process illustrated with respect to FIGS. 4 through 7. For example, the detector elements (e.g., 200, 310) can be formed after the wafer arrangement 500 has been scored by the scoring device 700. It will be appreciated that while FIG. 8 illustrates two detector elements (e.g., 200, 310), any number of detector elements can be fabricated as a result of the process illustrated with respect to FIGS. 4 through 7. Indeed, the detector elements (e.g., 200, 310) illustrated in FIG. 8 are merely exemplary and are not intended to be limiting on the total number of detector elements that may be formed as a result of the process illustrated with respect to FIGS. 4 through 7. Rather, in other examples, a plurality of detector elements (e.g., one or more) may be formed.

In this example, the detector element 200 comprises the scintillator array 202 that is supported on the first side 206 of the photodetector array 204. The electrical contact 210 is disposed on the second side 208 of the photodetector array 204. An optically reflective material 800 (e.g., a portion of the optically reflective material 600) can at least partially surround the scintillator array 202, such as by being disposed on at least five surfaces of the scintillator array 202.

The second detector element 310 is similar in some respects to the detector element 200. For example, the second detector element 310 comprises a second scintillator array 802 disposed on a first side 804 of a second photodetector array 806. A second electrical contact 808 is disposed on a second side 810 of the second photodetector array 806. A second optically reflective material 812 (e.g., a portion of the optically reflective material 600) can at least partially surround the second scintillator array 802, such as by being disposed on at least five surfaces of the second scintillator array 802.

Figure 9:
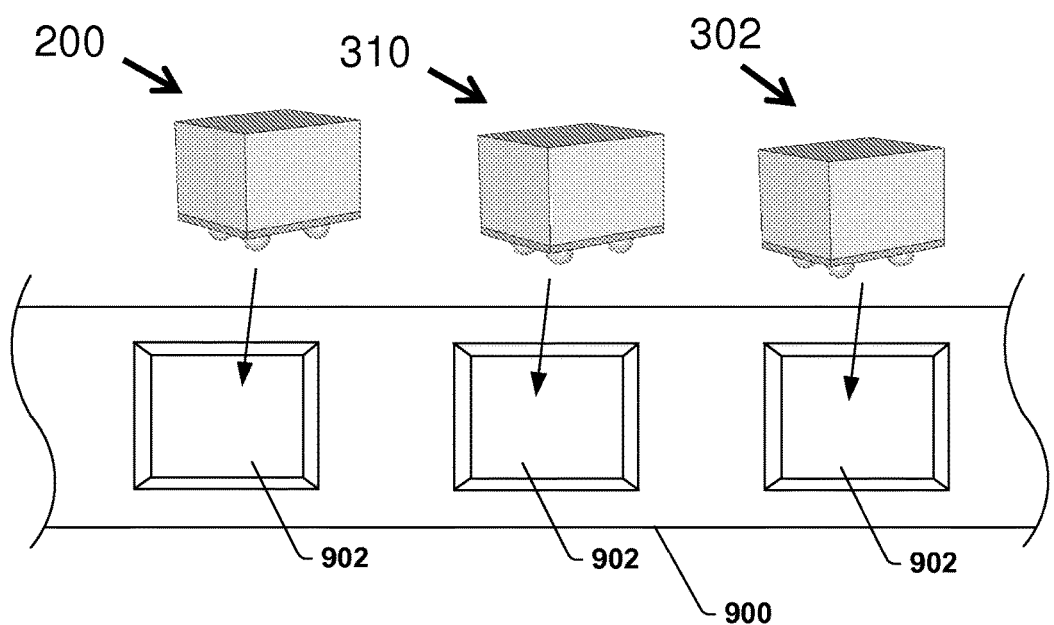
FIG. 9 illustrates a top-down view of an example carrier device that is configured to acquire one or more detector elements.

Turning to FIG. 9, the detector elements (e.g., 200, 310) can be acquired by a carrier device 900. In an example, the carrier device 900 may be comprised as part of a pick-and-place machine, surface mount technology, or other device for placing components onto a printed circuit board (e.g., 304). In the illustrated example, the carrier device 900 comprises a portion of a tape-and-reel feed mechanism that can load components (e.g., the detector element and/or portions of the detector element) into a pick-and-place machine. In other examples, the carrier device 900 may comprise a tube, tray, or other device onto which the detector elements (e.g., 200, 310) can be placed upon and/or supported by.

In the illustrated example, the carrier device 900 defines one or more carrier openings 902 into which the detector elements (e.g., 200, 302, 310) can be received. In this example, the carrier opening 902 is sized and/or shaped to receive the detector element (e.g., 200, 302, 310), such that the carrier device 900 can acquire the detector elements (e.g., 200, 302, 310).

It will be appreciated that while the carrier device 900 is illustrated as acquiring the detector elements (e.g., 200, 302, 310) comprising the scintillator array, the photodetector array, the electrical contact, and the optically reflective material, the carrier device 900 is not so limited. Rather, in other examples, the carrier device 900 can acquire (e.g., receive into the carrier opening 902) the detector element (e.g., 200, 302, 310) comprising the photodetector array 204 with the electrical contact 210 disposed on the second side 208 of the photodetector array 204. In such an example, the detector element 200 may not yet comprise the scintillator array 202 and/or the optically reflective material 212. In yet another example, the carrier device 900 can acquire the detector element 200 comprising the scintillator array 202 that is at least partially surrounded by the optically reflective material 212. In such an example, the detector element 200 may not yet comprise the photodetector array 204 and/or the electrical contact 210. In a further example, the carrier device 900 can acquire the detector element 200 comprising the scintillator array 202. In such an example, the detector element 200 may not yet comprise the photodetector array 204, the electrical contact 210, and/or the optically reflective material 212.

Figure 10:
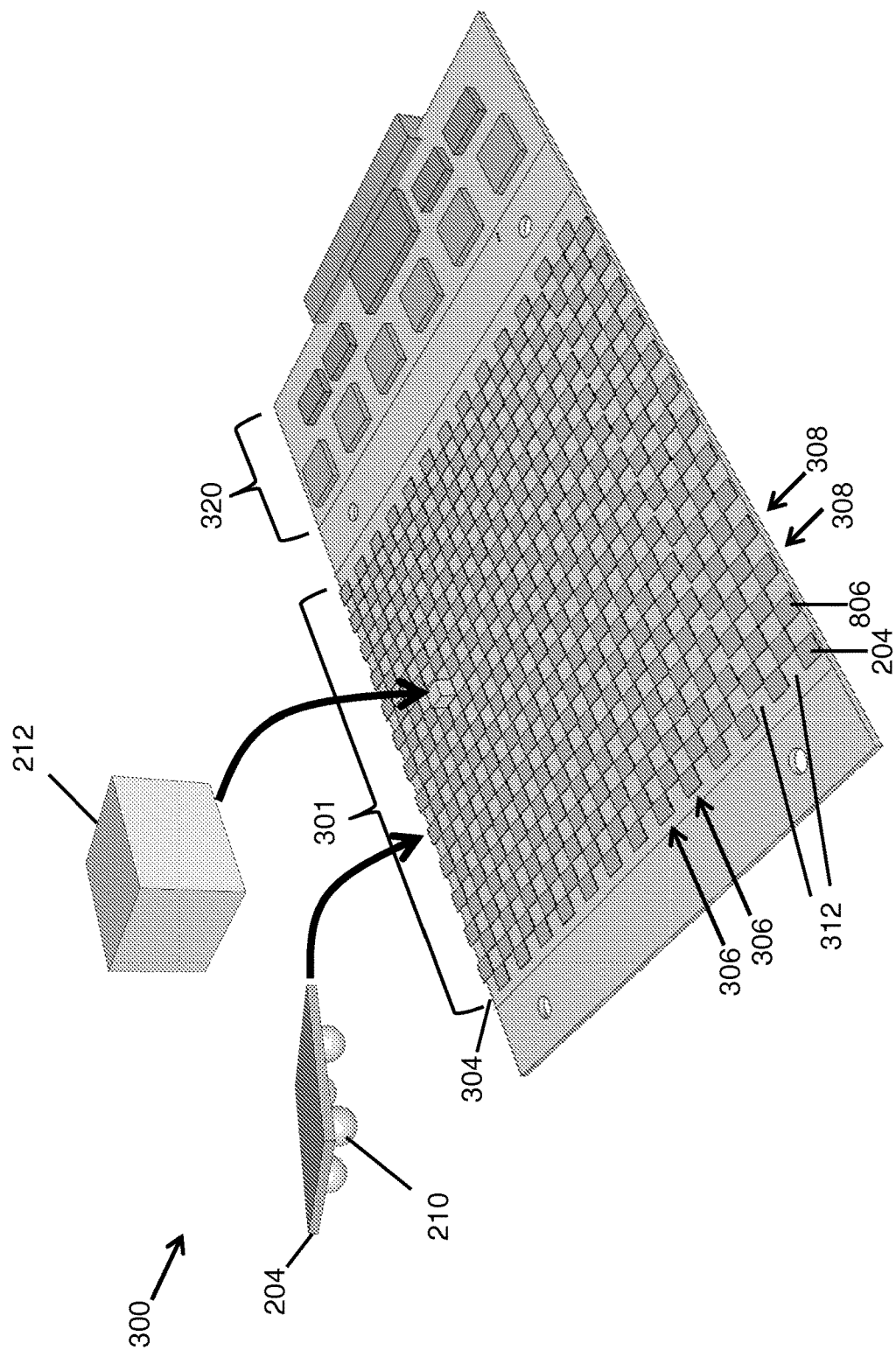
FIG. 10 illustrates a three-dimensional perspective view of an example detection assembly of a radiation detector system.

Turning to FIG. 10, the detection assembly 300 comprising the printed circuit board 304 is illustrated. The detector elements (e.g., 200, 302, 310) can be bonded to the printed circuit board 304. In an example, the carrier device 900, in association with a pick-and-place machine, can be used to bond the electrical contacts (e.g., 210, 808) to the printed circuit board 304 to physically and electrically couple the detector elements (200, 302, 310) to the printed circuit board 304.

In the illustrated example, the photodetector arrays (e.g., 204, 806) and the electrical contacts (e.g., 210, 808) can be bonded to contact pads, solder balls, conductive epoxy, electrically conductive spring contacts, etc. on the printed circuit board 304. The bonding can comprise, for example, a solder bond, anisotropic conductive film (ACF) bond, conductive epoxy bond, or other bonding elements. In this example, the carrier device 900 may acquire (e.g., as illustrated in FIG. 9) the detector element (e.g., 200, 302, 310) comprising the photodetector array (e.g., 204, 806) with the electrical contact (e.g., 210, 808) disposed on the second side (e.g., 208, 810) of the photodetector array (e.g., 204, 806). The detector element (e.g., 200, 302, 310) can then be bonded to the printed circuit board 304. For example, the electrical contact (e.g., 210, 808), disposed on the photodetector array (e.g., 204, 806), can be bonded to the contact pads, solder balls, conductive epoxy, electrically conductive spring contacts, etc. on the printed circuit board 304.

Subsequent to the photodetector array (e.g., 204, 806) and the electrical contact (e.g., 210, 808) being bonded to the printed circuit board 304, the scintillator array (e.g., 202, 802), surrounded by the optically reflective material (e.g., 212, 800, 812) can be disposed on the first side (e.g., 206, 804) of the photodetector array (e.g., 204, 806). In this example, a plurality of scintillator arrays (e.g., 202, 802), surrounded by the optically reflective material (e.g., 212, 800, 812), can be disposed onto the plurality of photodetector arrays, such that one scintillator array is disposed onto one of the photodetector arrays.

Figure 11:
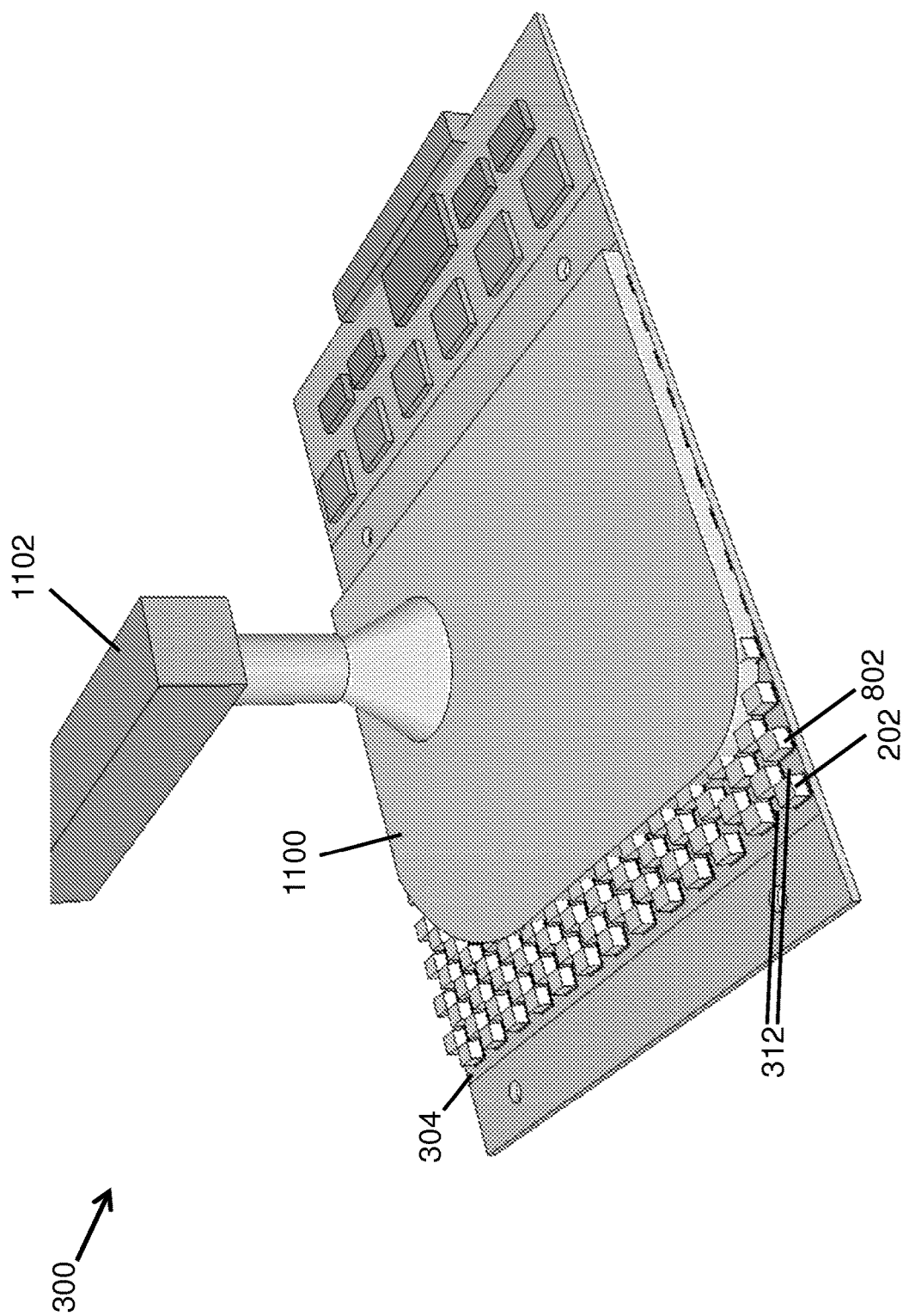
FIG. 11 illustrates a three-dimensional perspective view of an example detection assembly of a radiation detector system.

Turning to FIG. 11, in some embodiments, the scintillator arrays (e.g., 202, 802) can be applied to the photodetector arrays (e.g., 204, 806) prior to an optically reflective material 1100 being disposed over the scintillator arrays (e.g., 202, 802). In this example, the scintillator arrays (e.g., 202, 802) can be applied to the photodetector array (e.g., 204, 806) and the photodetector array (e.g., 204, 806) can be bonded to the printed circuit board 304. At that point, the optically reflective material 1100 can be disposed over the scintillator arrays (e.g., 202, 802). In such an example, the optically reflective material 1100 can be dispensed from a dispensing device 1102 onto the printed circuit board 304. The optically reflective material 1100 can be disposed within the spaces (e.g., 312) between neighboring scintillator arrays (e.g., 202, 802), such as within the space 312 between the first scintillator array 202 of the detector element 200 and the second scintillator array 802 of the second detector element 310, and/or disposed within spaces between neighboring scintillators of a scintillator array (e.g., 202, 802). The optically reflective material 1100 can be in a liquid and/or semi-liquid state upon being dispensed from the dispensing device 1102. As such, the optically reflective material 1100 can flow and surround the scintillator arrays (e.g., 202, 802). In some examples, a dam, barrier, or other blocking structure can be provided to limit the inadvertent flow of the optically reflective material 1100 to unintended areas. After the optically reflective material 1100 has been dispensed, a treatment (e.g., via a heat treatment, light treatment, etc.) may be applied to solidify the optically reflective material 1100, for example.

Figure 12:
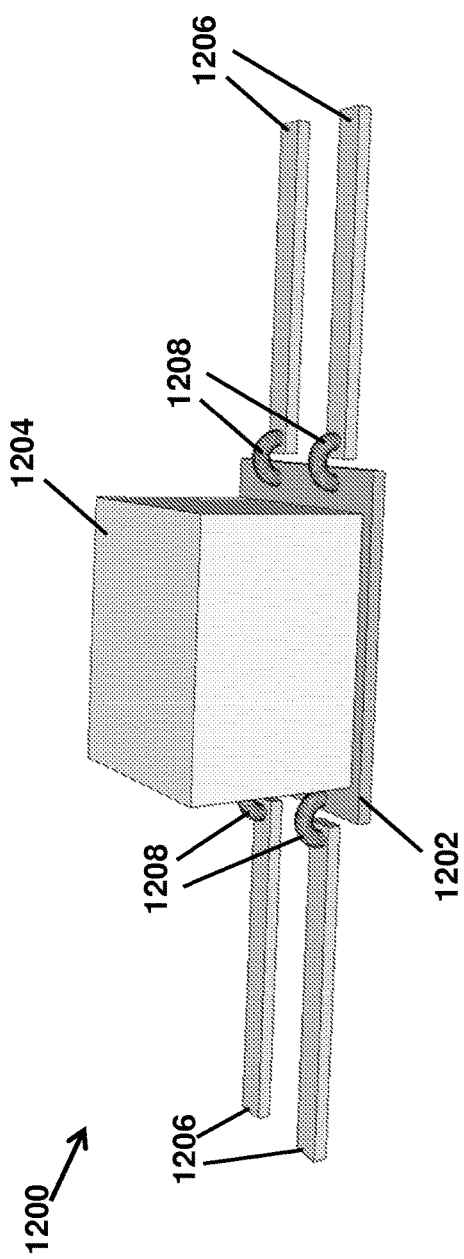
FIG. 12 illustrates a three-dimensional perspective view of an example detector element.

Turning to FIG. 12, an example detector element 1200 is illustrated. The detector element 1200 comprises a photodetector array 1202 supporting a scintillator array 1204. In some examples, the scintillator array 1204 can be supported on the photodetector array 1202 with an adhesive, such as glue, or the like. In an example, one or more leads 1206 of a lead frame can be bonded 1208 to the photodetector array 1202 to physically and/or electrically couple the photodetector array 1202 to the electrical channels (e.g., 322) of the printed circuit board (e.g., 304). It will be appreciated that the detector element 1200 is not limited to the illustrated wire bonding, as other electrical connection methods are possible.

Figure 13:
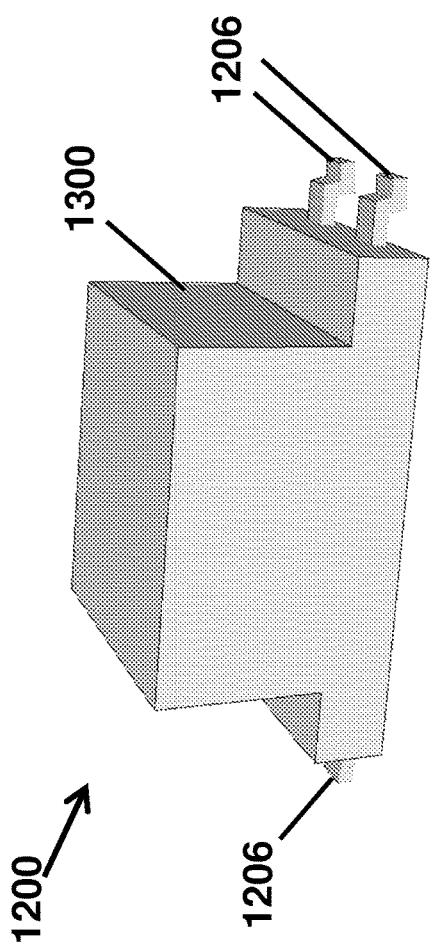
FIG. 13 illustrates a three-dimensional perspective view of an example detector element.

Turning to FIG. 13, an optically reflective material 1300 can be disposed over the detector element 1200. In an example, the optically reflective material 1300 can be molded over the photodetector array 1202, the scintillator array 1204, the leads 1206, and the wire bonds 1208. In addition, the leads 1206 can be formed or cut (e.g., trimmed, clipped, partially removed, etc.) so as to reduce a length of the leads 1206.

Figure 14:
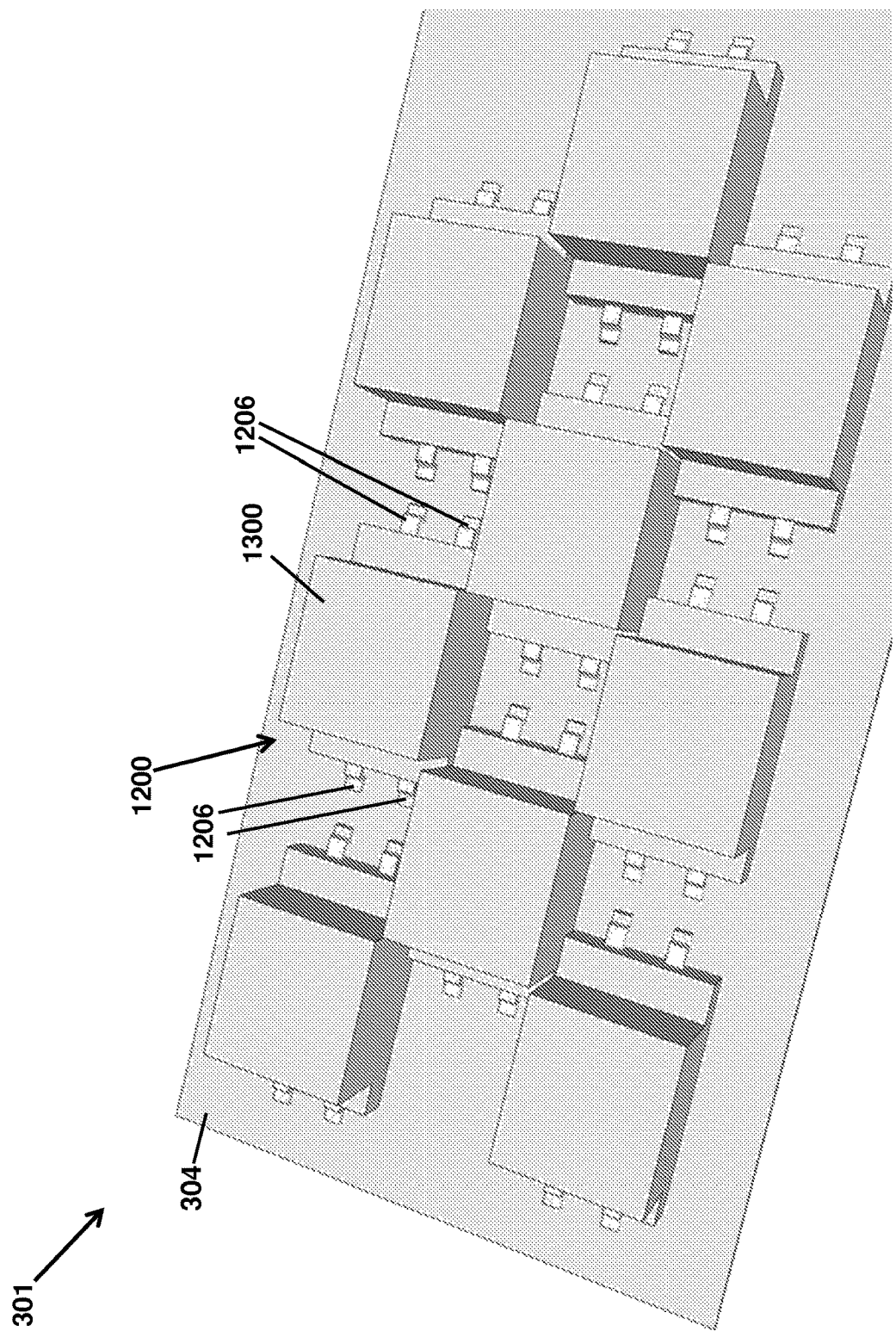
FIG. 14 illustrates a three-dimensional perspective view of an example radiation detection sub-assembly of a detection assembly.

Turning to FIG. 14, the radiation detection sub-assembly 301 of the detection assembly 300 is illustrated in which the detector element 1200 is bonded to the printed circuit board 304. In this example, the leads 1206 can be bonded to the printed circuit board 304, such as by soldering or the like. Once the leads 1206 are bonded to the printed circuit board 304, the detector element 1200 is physically and electrically coupled to the printed circuit board 304. As such, electrical signals that are generated by the detector element 1200 can be transmitted from the detector element 1200 and to the printed circuit board 304.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

As used in this disclosure, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Moreover, "exemplary" is used herein to mean serving as an example, instance, illustration, etc., and not necessarily as advantageous. As used in this disclosure, "or" is intended to mean an inclusive "or" rather than an exclusive "or". In addition, "a" and "an" as used in this disclosure are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". The claimed subject matter may be implemented as a method, apparatus, or article of manufacture (e.g., as software, firmware, hardware, or any combination thereof).

Further, unless specified otherwise, "first," "second," and/or the like are not intended to imply a temporal aspect, a spatial aspect, an ordering, etc. Rather, such terms are merely used as identifiers, names, etc. for features, elements, items, etc. (e.g., "a first channel and a second channel" generally correspond to "channel A and channel B" or two different (or identical) channels or the same channel).

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and/or advantageous for any given or particular application.

What is claimed is:

1. A detection assembly of a radiation detector system, the detection assembly comprising:
   a detector element, comprising:
      a scintillator array having a bottom surface;
      a photodetector array having a top surface facing the bottom surface of the scintillator array and supporting the scintillator array, wherein a surface area of the top surface of the photodetector array is greater than a surface area of the bottom surface of the scintillator array;
      an electrical contact disposed on a bottom surface of the photodetector array; and
      an optically reflective material, wherein:
         the optically reflective material is in contact with a top surface of the scintillator array and a sidewall of the scintillator array, and
         a sidewall of the optically reflective material is co-planar with a sidewall of the photodetector array; and
   a printed circuit board, the electrical contact bonded to the printed circuit board to physically and electrically couple the detector element to the printed circuit board.

2. The detection assembly of claim 1, wherein the scintillator array contains a single scintillator and the photodetector array contains a single photodiode.

3. The detection assembly of claim 1, wherein the scintillator array contacts the top surface of the photodetector array.

4. The detection assembly of claim 1, comprising a second detector element neighboring the detector element, wherein a space is defined between the detector element and the second detector element.

5. The detection assembly of claim 4, wherein the space has a width that is approximately equal to a detector width of the detector element.

6. The detection assembly of claim 4, wherein the optically reflective material is disposed within the space between the detector element and the second detector element.

7. The detection assembly of claim 1, wherein the detection assembly comprises a plurality of other detector elements, the detector element and the plurality of other detector elements arranged to form a two-dimensional detection assembly.

8. The detection assembly of claim 1, comprising:
   an analog-to-digital converter disposed on the printed circuit board, wherein:
      the analog-to-digital converter is disposed on a surface of the printed circuit board facing the photodetector array,
      the printed circuit board comprises a first set of one or more electrical channels through which signals from the photodetector array pass to the analog-to-digital converter, and the analog-to-digital converter is configured to process the signals to generate a digital output for the detector element.

9. The detection assembly of claim 8, comprising:
a correction component disposed on the printed circuit board, wherein:
the correction component is configured to weight the digital output based upon a calibration metric, and
the digital output is transmitted from the analog-to-digital converter to the correction component via a second set of one or more electrical channels of the printed circuit board.

10. A method of fabricating a detection assembly of a radiation detector system, the method comprising:
forming a detector element, comprising:
acquiring a photodetector array;
forming a bond between a lead and the photodetector array; and
forming an optically reflective material over the photodetector array and the bond, wherein the lead is partially exposed through the optically reflective material; and
bonding the lead to a printed circuit board to physically and electrically couple the detector element to the printed circuit board.

11. The method of claim 10, comprising applying a scintillator array on a first side of the photodetector array prior to forming the optically reflective material.

12. The method of claim 11, wherein forming the optically reflective material comprises coating the optically reflective material on at least five surfaces of the scintillator array.

13. The method of claim 11, wherein the bond is disposed on the first side of the photodetector array.

14. The method of claim 10, wherein forming the detector element comprises trimming the lead after forming the optically reflective material.

15. A radiation imaging system, comprising:
a radiation source configured to emit radiation photons; and
a radiation detector system configured to receive the radiation photons, the radiation detector system comprising a detection assembly comprising:
a first detector element, comprising:
a first scintillator array having a bottom surface;
a first photodetector array having a top surface facing the bottom surface of the first scintillator array and supporting the first scintillator array, wherein a surface area of the top surface of the first photodetector array is greater than a surface area of the bottom surface of the first scintillator array;
an electrical contact disposed on a bottom surface of the first photodetector array; and
an optically reflective material, wherein:
the optically reflective material is in contact with a top surface of the first scintillator array and a sidewall of the first scintillator array, and
a sidewall of the optically reflective material is co-planar with a sidewall of the first photodetector array;
a second detector element, comprising:
a second scintillator array;
a second photodetector array supporting the second scintillator array on a first side of the second photodetector array; and
a second electrical contact disposed on a second side of the second photodetector array; and
a printed circuit board, the electrical contact bonded to the printed circuit board to physically and electrically couple the first detector element to the printed circuit board and the second electrical contact bonded to the printed circuit board to physically and electrically couple the second detector element to the printed circuit board.

16. The radiation imaging system of claim 15, wherein a space is defined between the first detector element and the second detector element.

17. The radiation imaging system of claim 16, wherein the space has a width that is approximately equal to a detector width of the first detector element.

18. The radiation imaging system of claim 16, wherein the optically reflective material is disposed within the space between the first detector element and the second detector element.

19. The radiation imaging system of claim 15, wherein the first scintillator array contains a single scintillator and the first photodetector array contains a single photodiode.

20. The radiation imaging system of claim 15, wherein the radiation source is an x-ray source or a gamma-ray source.

* * * * *